United States Patent [19]

Shizume

[11] Patent Number: 4,691,379
[45] Date of Patent: Sep. 1, 1987

[54] MIXER CIRCUIT

[75] Inventor: Yasumichi Shizume, Tokyo, Japan

[73] Assignee: NEC Corporation, Japan

[21] Appl. No.: 825,235

[22] Filed: Feb. 3, 1986

[30] Foreign Application Priority Data

Feb. 1, 1985 [JP] Japan .................................. 60-18298
May 20, 1985 [JP] Japan ................................ 60-108643

[51] Int. Cl.$^4$ ............................................. H04B 1/26
[52] U.S. Cl. .................................... 455/319; 455/327; 455/330
[58] Field of Search ............... 455/325, 326, 327, 330, 455/317–319, 333

[56] References Cited

U.S. PATENT DOCUMENTS 4,211,977 7/1980 Shinkawa ............................. 455/330
4,531,236 7/1985 Ishihara .............................. 455/330
4,541,123 9/1985 Saka ................................... 455/330

Primary Examiner—Jin F. Ng
Attorney, Agent, or Firm—Ostrolenk, Faber, Gerb & Soffen

[57] ABSTRACT

Insertion and conversion losses in a dual frequency microwave mixer circuit are lessened with the improved configuration disclosed herein. The circuit provides inputs for two local oscillator signals, each coupled through a respective bandpass filter. In another embodiment, a pair of notch filters provided near the input reduce leakage from the oscillator inputs to the signal input.

12 Claims, 4 Drawing Figures

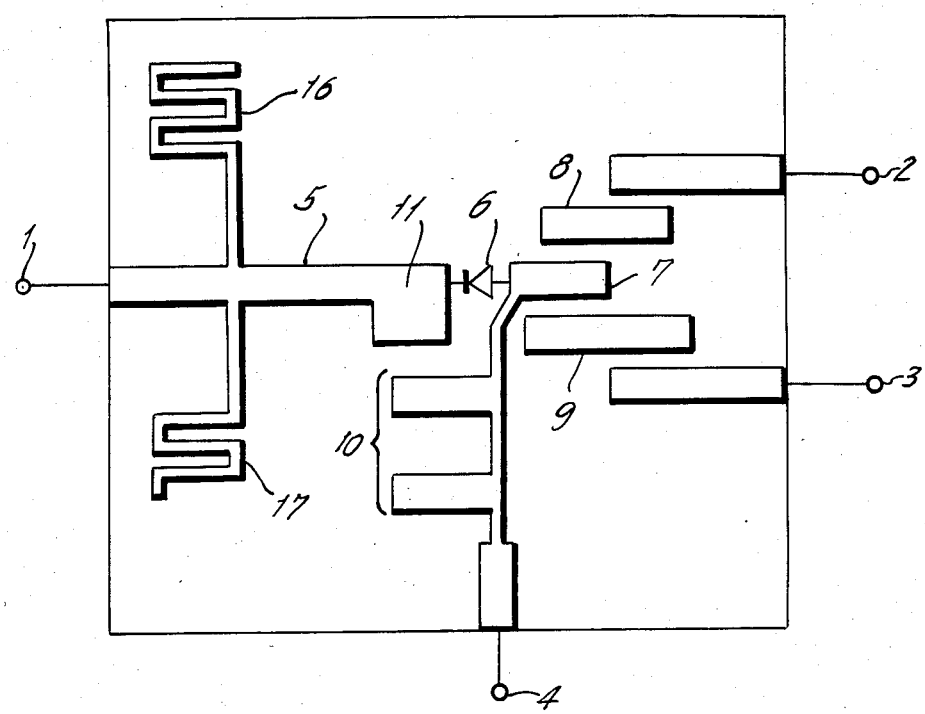
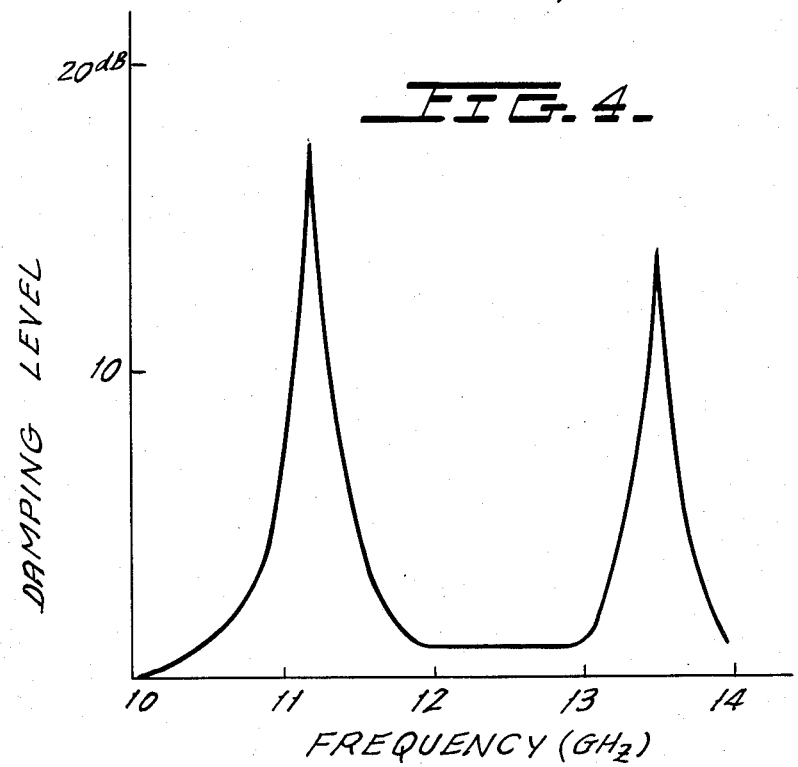

MIXER CIRCUIT

BACKGROUND OF THE INVENTION

This invention relates generally to a mixer circuit which receives an input microwave signal and converts it to an intermediate frequency (IF) signal of a lower frequency. More particularly, the present invention relates to a novel mixer circuit which is capable of receiving two local oscillation signals having different frequencies.

In a conventional single mixer circuit containing one mixer diode, one of the terminals of the mixer diode is connected to the end of a main line which receives an input microwave signal, and the other end of the mixer diode is connected to a line for taking out an intermediate signal. In this case, a local oscillation signal is supplied to the main line through a bandpass filter. If two kinds of local oscillation signals are to be alternatively supplied to the single mixer circuit of the kind described above in order to expand a reception frequency band, it is necessary to employ a circuit construction in which two local oscillation signal supply lines are aligned in parallel with each other on one side of the main line or two local oscillation signal supply lines are disposed on both sides of the main line.

However, in such circuit construction where the two local oscillation signal supply lines are coupled to the main line together, more conversion loss is derived and the conversion characteristic deteriorates. Further, a larger circuit space is necessary. For these reasons, the mixer circuit having such circuit construction is not practical.

SUMMARY OF THE INVENTION

Accordingly, an object of the present invention is to provide a mixer circuit capable of receiving two local oscillation signals which is free from conversion characteristic deterioration and which does not require a larger circuit space.

It is another object of the present invention to provide a mixer circuit in which the leakage of a local oscillation signal to an input terminal is suppressed.

According to the present invention, there is provided a mixer circuit which comprises a main line for receiving an input microwave signal at its one edge, a mixer diode for mixing the input microwave signal with one of first and second local oscillation signals, one of terminals of the mixer diode being coupled to the other edge of the mixer line, a coupling line coupled to the other terminal of the mixer diode, the coupling line substantially having ¼ wavelength with respect to the input microwave signal, two distribution-coupling type bandpass filters disposed along both sides of the coupling line for receiving the first and second local oscillation signals, respectively, and a delivering line coupled to the edge of the coupling line at which the mixer diode is connected for delivering an intermediate frequency signal.

BRIEF DESCRIPTION OF THE DRAWINGS

FIG. 3 is a block diagram showing a second embodiment of the present invention; and FIG. 4 is a diagram showing the characteristics of a notch filter used in the second embodiment of the present invention.

DESCRIPTION OF THE PRIOR ART

A prior art single mixer circuit will be first described prior to the description of the preferred embodiments in order to help understanding the present invention.

Figure 1:
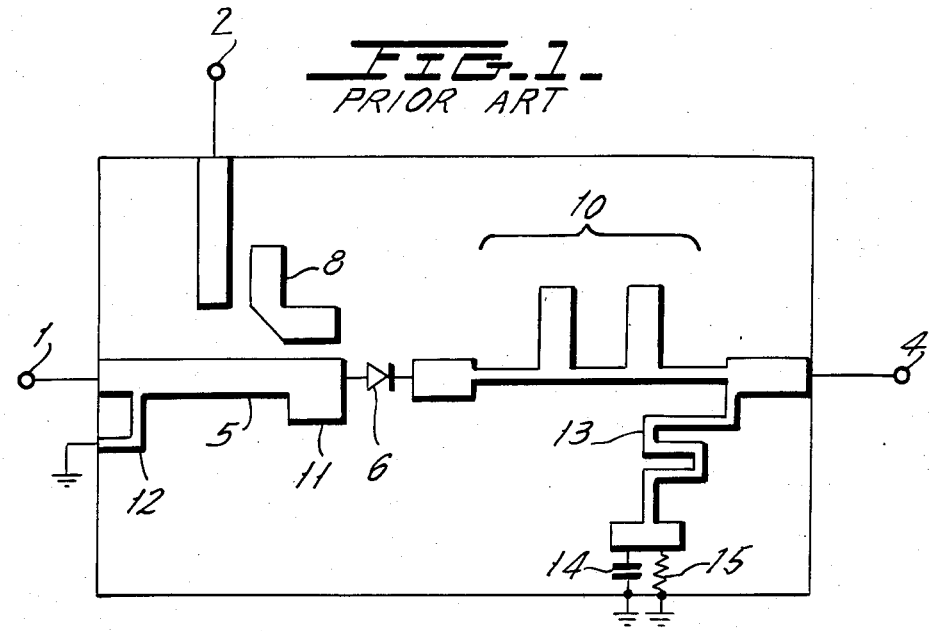
FIG. 1 is a circuit diagram of a single mixer circuit which receives one local oscillation signal according to the prior art.

In a conventional single mixer shown in FIG. 1, only one local oscillation frequency has been used. In the Figure, a microwave signal inputted from an input terminal 1 passes through a main line 5 and is applied to a mixer diode 6. On the other hand, a local oscillation signal inputted from a terminal 2 passes through a distribution-coupling type bandpass filter (hereinafter referred to as "BPF") 8 coupled with the main line 5 and is applied to the diode 6. An intermediate frequency signal (hereinafter referred to as the "IF signal") is generated upon the application of the input microwave signal and the local oscillation signal to the mixer diode 6 and picked up through a low bandpass filter (hereinafter referred to as "LPF") 10 to an IF output terminal 4. The LPF 10 removes the input microwave signal and the local oscillation signal. In this case, if another local oscillation signal having a different frequency is supplied in order to receive another microwave signal so as to make this mixer circuit operable in a wider reception band, a separate local oscillation signal supply line and BPF should be disposed, in principle, on the opposite side of the BPF 8 with respect to the main strip line 5, or in parallel with the BPF 8. However, as described above, this circuit arrangement can not be configured for practical use.

DESCRIPTION OF THE PREFERRED EMBODIMENTS

Figure 2:
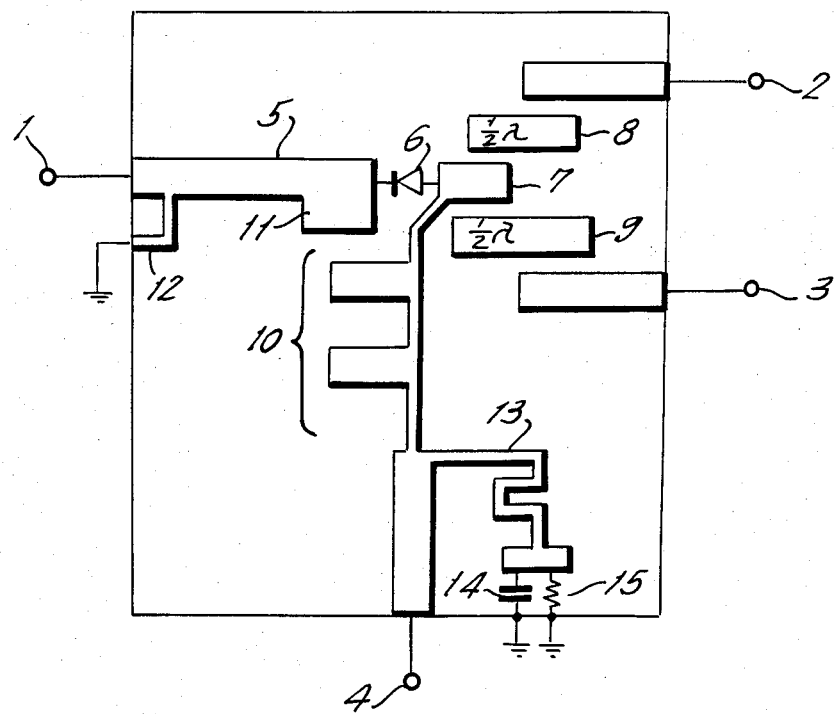
FIG. 2 is a block diagram showing a first embodiment of the present invention.

Next, a first embodiment of the present invention will be described with reference to FIG. 2. In this, Figure, an input microwave signal from an input terminal 1 is applied through a main line 5 to a mixer diode 6. A distribution-coupling line 7 having a length about ¼ of the wavelength with respect to the input microwave signal is connected to the other lead of the mixer diode 6. Therefore, the line 7 is disposed on the opposite side to the main line 5 with respect to the mixer diode 6. On the other hand, first and second local oscillation signal supply lines and corresponding BPFs 8 and 9 are disposed along both sides of the distribution-coupling line 7 as shown in FIG. 2. Thus, the first and second local oscillation signals supplied from terminals 2 and 3 are alternatively supplied through BPFs 8 and 9 and through the distribution-coupling line 7 to the mixer diode 6. The BPFs 8 and 9 have a length of ½λ (λ: wavelength) with respect to respective local oscillation frequencies.

As the performance required for these BPFs 8 and 9, the damping characteristics of at least 10 dB with respect to the input microwave signal and to the counterpart local oscillation signal, and the insertion loss of up to 3 dB are necessary. When these requirements are satisfied, the local oscillation signal can be applied efficiently to the mixer diode 6. Therefore, the signal power of the local oscillation signal may be of a low level, and the leakage of the input microwave signal to the local oscillation signal input terminals 2 and 3 can be reduced. Furthermore, as shown in FIG. 2, the present invention reduces the necessary area required for the circuit configuration.

In the embodiment, the IF signal is delivered from the tip of the coupling line 7 at the side where the diode 6 is connected. The delivered. IF signal is supplied through a LPF 10 to an output terminal 4. This LPF 10 consists of a tip-open stub having a length of about ¼λ with respect to a cut-off frequency in an image band, and a high impedance line. A stub 11 functions as a matching circuit to reduce the conversion loss in the mixer diode 6, and as a matching circuit for the local oscillation signal A high impedance line 12 grounded at one end serves as a current feedback loop for the mixer diode 6, and its length is selected to be about ¼λ of the input microwave signal. A resistor 15 is disposed to limit the current in the current feedback loop of the mixer diode 6. One of the leads of the resistor 15 is connected to the impedance line 13 and the other is grounded. In order to prevent a undesirable influence upon the IF signal derived by the resistor 15, a capacitor 14 is disposed in parallel to the resistor 15. The entire length through the high impedance line 13 and the register 15 (or the capacitor 14) is set to be about ¼λ of the IF signal.

It is assumed in this embodiment that the input microwave frequency bandwidth is 1 GHz from 11.7 to 12.7 GHz and the intermediate frequency bandwidth is 500 MHz, from 1.0 to 1.5 GHz. Then, the first local oscillation frequency is selected to 10.70 GHz and the second local oscillation frequency, 11.20 GHz. In this case, the low bandpass filter 10 having a ¼λ stub has the characteristic of the cut-off frequency of 9.0 GHz in the image band.

In the microwave band receiver capable of using two local oscillation signals, as shown in FIG. 2, a frequency gap getween the two local oscillation signals is as relatively small as 500 MHz, for example, and an isolator cannot be utilized therein because of structural requirement of the receiver, i.e., requirement of a more compact receiver. Furthermore, the number of stages of bandpass filters (not shown) to be interposed in a transmission line before the mixer circuit can be as few as three stages, for example. In this case, a local oscillation frequency close to a cut-off range of the bandpass filter (this signal will be hereinafter referred to as a "first local oscillation signal") can be easily damped by about 20 dB, but a local oscillation frequency close to a passing range (this signal will be hereinafter referred to as a "second local oscillation signal") can be damped only by about 5 dB. Therefore, the leakage of the second local oscillation signal to the microwave input terminal occurs and it becomes a drawback. In order to eliminate this drawback, a second embodiment of the present invention is provided by including two notch filters in order to trap the second local oscillation signal. One of the two notch filters is formed by disposing a tip-open type high impedance line having a ¼λ of a frequency of;

$$\frac{1}{2n+1} f_e$$

(where n=an integer of 2 or more and $f_e$=frequency to be damped) on one side of the main line between the microwave input terminal and the frequency conversion portion, and the other is formed by disposing another tip-open type high impedance line having a ¼λ of the frequency of about $$\frac{2(n+1)}{(2n+1)^2} f_e$$

on the opposite side of the main line.

In FIG. 3 showing the block diagram of the second embodiment, a first notch filter 16 and a second notch filter 17 are disposed in such a manner as to interpose the main line 5 therebetween. Except for these notch filters 16 and 17, the circuit configuration of the second embodiment is the same as the first embodiment shown in FIG. 2. In FIG. 3, elements 12, 13, 14 and 15 shown in FIG. 2 are omitted. The notch filters 16 and 17 reduce the leakage of the second local oscillation signal (11.2 GHz) to the input terminal 1.

If a notch filter is realized by a line of ¼λ of the second local oscillation frequency itself, a damping curve shifting from a damping range to a passing range becomes smooth when the passing range is relatively as narrow as about 500 MHz, and hence the pass band cannot be expanded. In this embodiment, a 1/5 (n=2) frequency is selected and the notch filter utilizing its higher-order (harmonic) mode is realized. Thus, the pass band can be expanded. In practice, a tip-open line having a ¼λ of 1/5 of the second local oscillation frequency is disposed to the main line as the first notch filter 16. This tip-open line consists of a thin high impedance line (e.g., about 150 ohms when an ethylene tetrafluoride/glass cross/copper plated substrate is used). Furthermore, in order to further expand the passing range, the second notch filter 17 is disposed on the opposite side of the main line 5. In the second notch filter 17, the tip-open line has a length of ¼λ of a 1/5 frequency of 6/5 frequency with respect to the second local oscillation frequency, i.e., 6/25 of the second local oscillation frequency (n=2). Since the second notch filter 17 is added, the damping curve becomes sharp, and, thus, the passing range can be expanded. When the single mixer circuit shown in this embodiment is used for a frequency conversion unit, a matching impedance to the mixer diode 6 must be adjusted while the notch filters are included.

Next, the case of FIGS. 3 in which the ethylene tetrafluoride/glass cross/copper plated substrate is used will be explained. It is assumed in the same way as in the first embodiment that the input microwave signal is in the 1 GHz band of 11.7 to 12.7 GHz, the intermediate frequency is in the 500 MHz band of 1.0 GHz to 1.5 GHz, the first local oscillation frequency is 10.70 GHz and the second local oscillation frequency is 11.20 GHz. In this case, the 11.2 GHz of the second local oscillation frequency should be damped. Therefore, the first notch filter 16, consists of the tip-open line having the ¼λ of 22.24 GHz (11.2×1/5) and having a characteristic impedance of 150Ω, and the second notch filter 17 consists of the tip-open line having the ¼λ of 2.688 GHz (11.2×6/5×1/5) and having characteristic impedance of 150Ω. As a result, damping of 17.5 dB at 11.2 GHz and an insertion loss of about 1 dB at 11.9 to 13.0 GHz can be obtained as shown in FIG. 4. Thus, the second embodiment can provide the effect of limiting the leakage of the second local oscillation signal to the microwave input terminal.

As described above, in the single mixer circuit in accordance with the present invention, in order to supply the two local oscillation signals, the distribution-coupling line having a about ¼λ of the input microwave signal is connected to the mixer diode and two distribution-coupling type bandpass filters are disposed on both the sides to the distribution-coupling line. Therefore, the present invention provides the following effects: (1) The conversion loss in the mixed circuit can be reduced. (2) The local oscillation signal power may be small. (3) The single mixer having a small circuit area can be accomplished.

What is claimed is:

1. A mixer comprising:

first line means having a first end for receiving an input radio frequency signal;

first and second terminals for receiving first and second local oscillation signals having different frequencies;

a mixer diode having first and second terminals, one of said terminals of said mixer diode being coupled to a second end of said first line means;

second line means coupled to said second terminal of said mixer diode, said second line means having a length which is approximately ¼ of the wavelength of said input radio frequency signal;

first and second coupling means for coupling said second line means, to said first and second terminals, respectively; and third line means coupled to the junction of said second line means and said mixer diode for delivering an intermediate frequency signal.

2. A mixer as claimed in claim 1 further comprising first and second notch filters coupled to each side of said first line means for filtering out said local oscillation signal, said first notch filter consisting of a line having a length of ¼ wavelength with respect to 1/(2n+1) frequency of said local oscillation signal and said second notch filter consisting of a line having a length of ¼ wavelength with respect to $$\frac{2(n+1)}{(2n+1)^2}$$

frequency of said local oscillation signal, where n is an integer greater than 1.

3. A mixer as claimed in claim 2 wherein said first line means further includes a matching stub for reducing coversion loss in the mixer diode.

4. A mixer as claimed in claim 1 wherein said first and second coupling means comprise first and second distribution-coupling-type bandpass filters, respectively, disposed adjacent said second line means, said first and second bandpass filters having different pass bands, and fourth and fifth line means disposed adjacent said first and second bandpass filters, respectively, and coupled to said first and second terminals, respectively.

5. A mixer as claimed in claim 4, further comprising a filter means disposed in said third line means for filtering out an image frequency.

6. A mixer as claimed in claim 5 wherein said filter means comprises a resistor and a capacitor in parallel connected to ground.

7. A mixer as claimed in claim 6 wherein said first line means further includes a matching stub for reducing conversion loss in the mixer diode.

8. A mixer as claimed in claim 7 wherein said first line means further includes current feedback loop means.

9. A mixer as claimed in claim 8 wherein said current feedback loop means includes a high impedance line connected to ground.

10. A mixer as claimed in claim 4 further comprising a filter means coupled to said first line means for filtering out said local oscillation signal.

11. A mixer as claimed in claim 6 wherein said first line means further includes a matching stub for reducing conversion loss in the mixer diode.

12. A mixer as claimed in claim 4 wherein said second line means has two generally parallel sides and wherein said first and second bandpass filters are each disposed along a different one of said sides.

* * * * *